(12) United States Patent
Jonssön et al.

(10) Patent No.: US 6,287,881 B1
(45) Date of Patent: Sep. 11, 2001

(54) SEMICONDUCTOR DEVICE WITH LOW PARASITIC CAPACITANCE

(75) Inventors: Jan Jonssön; Mikael Wickström, both of Järfälla (SE)

(73) Assignee: Mitel Semiconductor AB, Jarfalla (SE)

( * ) Notice: Subject to any disclaimer, the term of this patent is extended or adjusted under 35 U.S.C. 154(b) by 0 days.

(21) Appl. No.: 09/425,953

(22) Filed: Oct. 25, 1999

(51) Int. Cl.7 ................................................. H01L 21/00
(52) U.S. Cl. .............................. 438/25; 438/26; 438/516; 438/520; 438/537
(58) Field of Search ................................ 438/22, 23, 25, 438/24, 126, 516, 514, 520, 537

(56) References Cited

U.S. PATENT DOCUMENTS

| | | |
|---|---|---|
| 3,748,480 | 7/1973 | Coleman . |
| 3,881,113 | 4/1975 | Rideout et al. . |
| 4,124,860 | 11/1978 | Johnson . |
| 4,136,351 | 1/1979 | Sugawara et al. . |
| 4,143,385 | 3/1979 | Miyoshi et al. . |
| 4,274,104 | 6/1981 | Fang et al. . |
| 4,275,404 | 6/1981 | Cassiday et al. . |
| 5,018,004 | * 5/1991 | Okinaga et al. . |
| 5,346,841 | * 9/1994 | Yajima . |

FOREIGN PATENT DOCUMENTS

| | | |
|---|---|---|
| 0753912 | 7/1997 | (EP) . |
| WO 93/07647 | 4/1993 | (WO) . |

* cited by examiner

*Primary Examiner*—Long Pham
(74) *Attorney, Agent, or Firm*—Laubscher & Laubscher

(57) ABSTRACT

A method of fabricating a semiconductor device having active components grown on a substrate, involves providing a semiconductor substrate on which the active components are grown, and doping the semiconductor substrate to render it non conductive and thereby reduce parasitic capacitance between active components thereon. The components typically comprise a VCSEL and monitor. The doped substrate reduces parasitic capacitance.

12 Claims, 1 Drawing Sheet

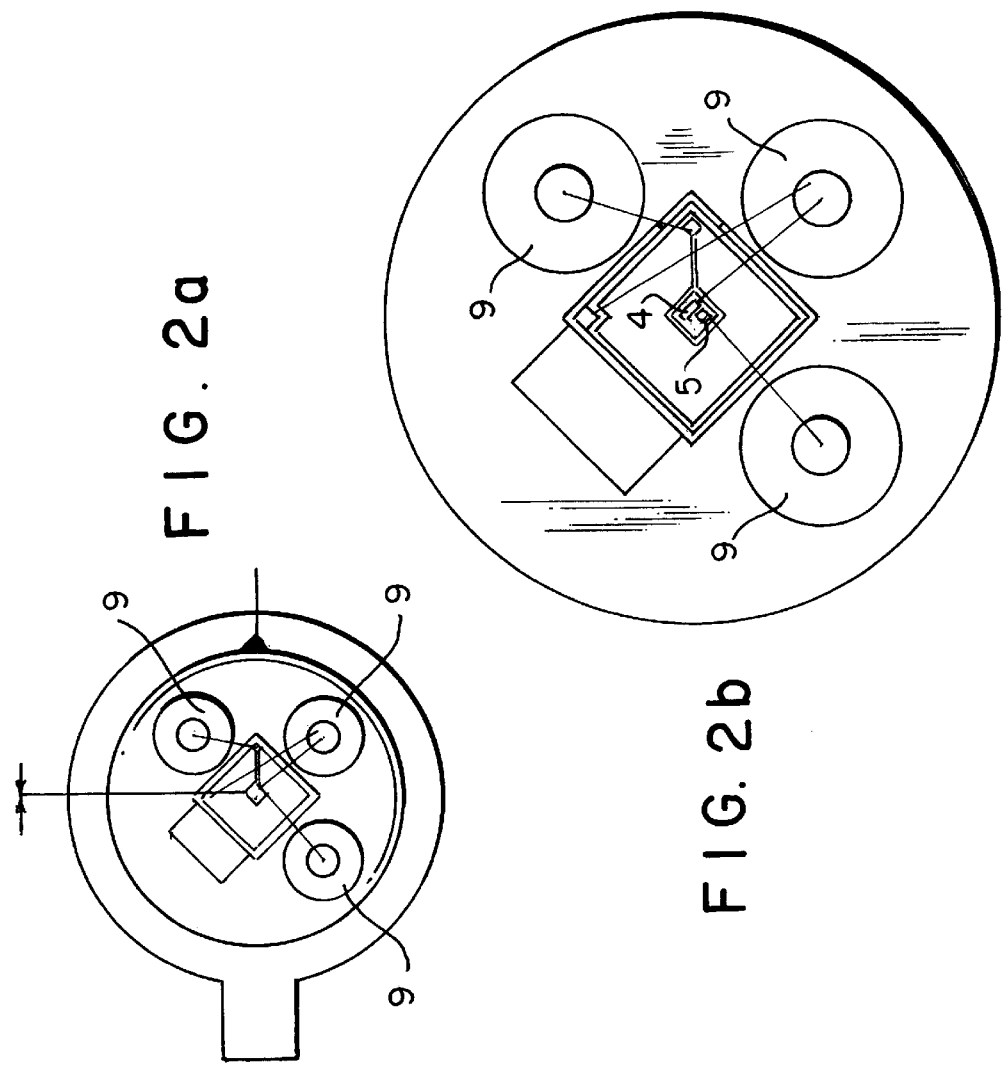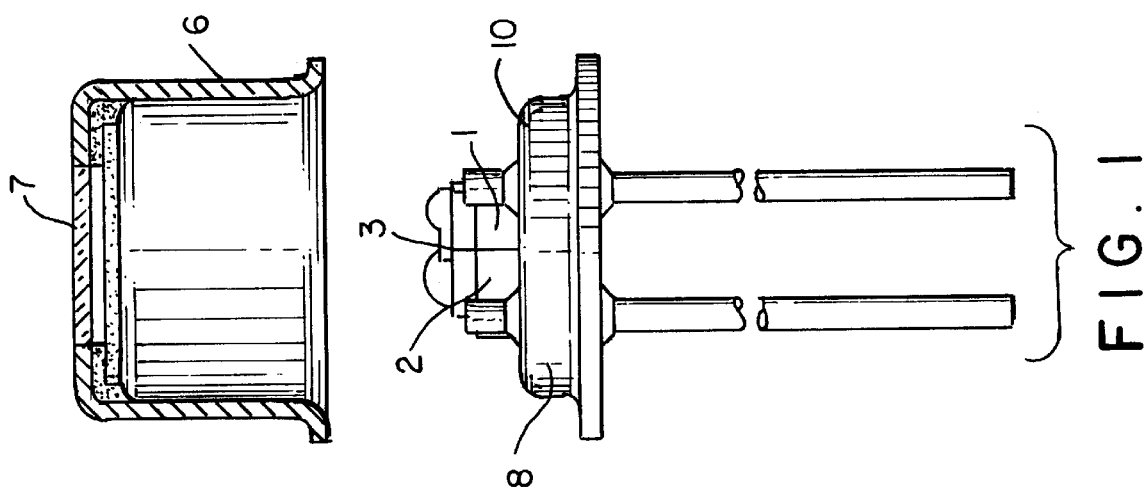

SEMICONDUCTOR DEVICE WITH LOW PARASITIC CAPACITANCE

FIELD OF THE INVENTION

This invention relates to the field of optoelectronics, and more particularly to light emitting diodes, such as VCSELs (Vertical Cavity Surface Emitting Lasers).

BACKGROUND OF THE INVENTION

VCSELs, or Vertical Cavity Surface-Emitting Lasers, are semiconductor mirolaser diodes that emit light vertically from the surface of a fabricated wafer. VCSELs have many advantages including photolithographically defined geometries, circular output beams, high fiber optic coupling efficiencies, extremely low power consumption, and ultra-high modulation rates for advanced information processing. VCSELs are finding increasing application in the telecommunications industry due to their high performance with narrow linewidth.

In the design of an emitting device, it is common practice to provide a monitoring device, such as a photodiode. The monitor is placed under the emitting device or on the same substrate as the emitting device adjacent to it. This is used to monitor light output for control purposes. The output of the monitoring device can be used control the drive conditions of the emitting device. This can be used to maintain the optical output of a VCSEL at a constant power level. In many cases, it is desirable to mount the emitting device on top of a monitor. In many cases, it is desirable to mount the monitoring device on top of the VCSEL. The problem with this arrangement is that it a parasitic capacitance occurs between the devices. Depending on the pin configuration, the capacitance may significantly deteriorate the high frequency properties of the emitting component. For example, the output of the VCSEL is lowered at higher speeds.

Due to this effect, the number of possible pin configurations is limited for high frequency applications, for example, gigabit data communication. An object of the invention is to alleviate this problem.

SUMMARY OF THE INVENTION

According to the present invention there is provided a method of fabricating a semiconductor device having at least one active component grown on a substrate, comprising the steps of providing a semiconductor substrate on which said active components are grown; and doping or implanting said semiconductor substrate to render it non conductive and thereby reduce parasitic capacitance between active components thereon or between it and a surface on which it is mounted.

The substrate is normally doped prior to growing the components. The substrate should be semi-isolating or have its backside made non-conductive by ion implantation, for example, with ions of hydrogen, oxygen, or helium. The non-conductivity can be obtained before growth of the emitting component(s), for example, by growth on a non-conductive sample, or after the growth of the emitting components, for example, by implantation or fusion to a non-conductive substrate.

The invention is specifically applicable to a VCSEL and monitoring device, such as a photodetector. The invention permits the fabrication of n-type VCSELs with maximum performance and different types of monitor or metal plated area with low parasitic capacitance.

The invention also provides a semiconductor device having active components grown on a substrate, comprising a plurality of active components; and a semiconductor substrate supporting said active components, said semiconductor substrate being doped or implanted to render it non conductive and thereby reduce parasitic capacitance between said active components thereon.

BRIEF DESCRIPTION OF THE FIGURES

The invention will now be described in more detail, by way of example, only with reference to the accompanying drawings, in which:

FIG. 1 is an exploded cross-sectional view of a semiconductor device made in accordance with the principles of the invention;

FIG. 2a is a plan view of the device shown in FIG. 1; and

FIG. 2b is shows a detail of FIG. 2b.

DETAILED DESCRIPTION

In the drawings a semiconductor device has a substrate 1 of semiconductor material, for example, of GaAs or InP. Normally this substrate is n-doped to a level of $10^{17}$–$10^{19}$ cm$^{-3}$. A monitor 2 is formed on the substrate 1 in a known manner. The VCSEL 3 is formed on the monitor 2. The VCSEL typically has an anode and cathode arranged on the top side thereof.

The device may, for example, consist of a conducting layer grown on the substrate 1, a first layer of DBR (distributed Bragg reflector) mirrors, an active layer, a passivated region, a second layer of DBR mirrors, and two bonding pads 4, 5. One of the bonding pads is in electrical contact with the second layer of dielectric mirrors and the second bondpad is in contact with the conducting layer grown on the substrate. The invention is of course not limited to VCSELs with DBR mirrors, but is also applicable to VCSELs with wafer-fused mirrors and dielectric mirrors.

A cap 6 with a transparent window 7 is placed over the assembly in a conventional manner. The assembly is mounted on a header block 8 and contact is made through terminal posts 9.

In accordance with the principles of the invention, the semiconductor material should be semi-isolating or made semi-insulating by doping or by implanting the backside of the substrate with hydrogen or other ions at a concentration high enough to render at least part of it effectively non-conductive.

If desired, an insulator, for example, polyamide 10 or other isolating substrate, can be placed as a building block under the solder pad on which the VCSEL is placed. This decreases the parasitic capacitance, but may also decrease the heat conductivity and lower VCSEL performance. This arrangement is suitable for some applications, such as high temperature and temperature sensitive applications.

The invention can be applied to the integration of the VCSEL with many types of devices where parasitic impedance would be a problem, for example, drivers and detectors. The invention is applicable to other types of semiconductor device, such as light emitting diodes and detectors with both contacts on the top surface.

What is claimed is:

1. A method of fabricating a semiconductor device having at least one active component grown on a substrate, comprising the steps of:

a) providing a semiconductor substrate on which said at least one active component is grown, said semiconductor substrate having a backside; and b) implanting said backside of said semiconductor substrate with ions to render said backside of said semiconductor substrate non-conductive and thereby reduce parasitic capacitance between said semiconductor substrate and a surface on which said semiconductor substrate is mounted.

2. A method as claimed in claim 1, wherein said at least one active component is grown on said substrate prior to said implanting step.

3. A method as claimed in claim 1, wherein said at least one active component is grown on said substrate after said implanting step.

4. A method as claimed in claim 1, wherein said at least one active component comprises respectively a light source and a monitoring device for monitoring the intensity of said light source.

5. A method as claimed in claim 4, wherein said light source is a VCSEL, said VCSEL having an anode and a cathode arranged on a top side thereof.

6. A method as claimed in claim 1, in which said ions are selected from the group consisting of hydrogen, helium or oxygen.

7. A method as claimed in claim 1, wherein at least one active component is placed on a non-conductive building block.

8. A method as claimed in claim 7, in which said non-conductive building block is made of polyamide.

9. A method as claimed in claim 8 wherein said at least one active component comprises respectively a light source and a monitoring device for monitoring the intensity of said light source.

10. A method as claimed in claim 9, wherein said light source is a VCSEL.

11. A method as claimed in claim 8, wherein said VCSEL has an anode and a cathode arranged on a top side thereof.

12. A method as claimed in claim 1, wherein said ions are hydrogen or helium.

* * * * *